United States Patent
Lee et al.

(10) Patent No.: US 11,521,863 B2
(45) Date of Patent: Dec. 6, 2022

(54) METHOD OF FABRICATING A SEMICONDUCTOR PACKAGE

(71) Applicant: SAMSUNG ELECTRONICS CO., LTD., Suwon-si (KR)

(72) Inventors: Seon Ho Lee, Cheonan-si (KR); Yeonseok Kim, Hwaseong-si (KR); Eunyeong Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 46 days.

(21) Appl. No.: 17/197,274

(22) Filed: Mar. 10, 2021

(65) Prior Publication Data
US 2022/0013370 A1    Jan. 13, 2022

(30) Foreign Application Priority Data

Jul. 10, 2020  (KR) ................ 10-2020-0085077

(51) Int. Cl.
*H01L 21/48* (2006.01)
*H01L 25/00* (2006.01)
(Continued)

(52) U.S. Cl.
CPC ...... *H01L 21/4846* (2013.01); *H01L 21/6836* (2013.01); *H01L 25/50* (2013.01);
(Continued)

(58) Field of Classification Search
CPC .. H01L 21/4846; H01L 21/6836; H01L 25/50
See application file for complete search history.

(56) References Cited

U.S. PATENT DOCUMENTS 8,617,930 B2    12/2013  Inada et al.
8,618,648 B1 *  12/2013  Kwon ............... H01L 24/75
                                                    257/621

(Continued)

FOREIGN PATENT DOCUMENTS

JP    5341691    11/2013
JP    5837272    12/2015
(Continued)

OTHER PUBLICATIONS

S. Beke et al., "Towards excimer-laser-based stereolithography: a rapid process to fabricate rigid biodegradable photopolymer scaffolds", J. R. Soc. Interface (2012) 9, 3017-3026, Jun. 2013, pp. 3017-3026.

*Primary Examiner* — Errol V Fernandes
(74) *Attorney, Agent, or Firm* — F. Chau & Associates, LLC

(57) ABSTRACT

Disclosed is a method of fabricating a semiconductor package. The method may include providing a preliminary interposer substrate including connection terminals on a carrier substrate such that the connection terminals are oriented outward, preparing a release film including a base layer, an intermediate layer, and an adhesive layer, attaching the connection terminals to a first surface of the release film, detaching the carrier substrate from the preliminary interposer substrate, cutting the preliminary interposer substrate to form a plurality of interposer substrates separated from each other, irradiating a first light of a first wavelength onto the release film to form an air gap between the connection terminals and the release film, and detaching the interposer substrates from the release film. The intermediate substrate may include a light absorber absorbing the first light.

20 Claims, 15 Drawing Sheets

(51) Int. Cl.
   *H01L 21/683*   (2006.01)
   *H01L 23/00*   (2006.01)
   *H01L 25/065*   (2006.01)

(52) U.S. Cl.
   CPC .............. *H01L 24/16* (2013.01); *H01L 24/32* (2013.01); *H01L 24/73* (2013.01); *H01L 25/0655* (2013.01); *H01L 2224/16227* (2013.01); *H01L 2224/32225* (2013.01); *H01L 2224/73204* (2013.01)

(56) References Cited

U.S. PATENT DOCUMENTS

| | | |
|---|---|---|
| 2013/0071658 A1 | 3/2013 | Nomura et al. |
| 2014/0017852 A1* | 1/2014 | Kwon ................ H01L 21/4853 257/E21.705 |
| 2014/0070424 A1* | 3/2014 | Chuang .................. H01L 24/17 257/774 |
| 2015/0017434 A1 | 1/2015 | Dronen et al. |
| 2016/0013089 A1 | 1/2016 | Takamoto et al. |
| 2016/0172230 A1 | 6/2016 | Takamoto et al. |
| 2019/0148207 A1 | 5/2019 | Chang et al. |

FOREIGN PATENT DOCUMENTS

| | | |
|---|---|---|
| KR | 10-2019-0054467 | 5/2019 |
| KR | 10-2019-0093162 | 8/2019 |

\* cited by examiner

FIG. 14
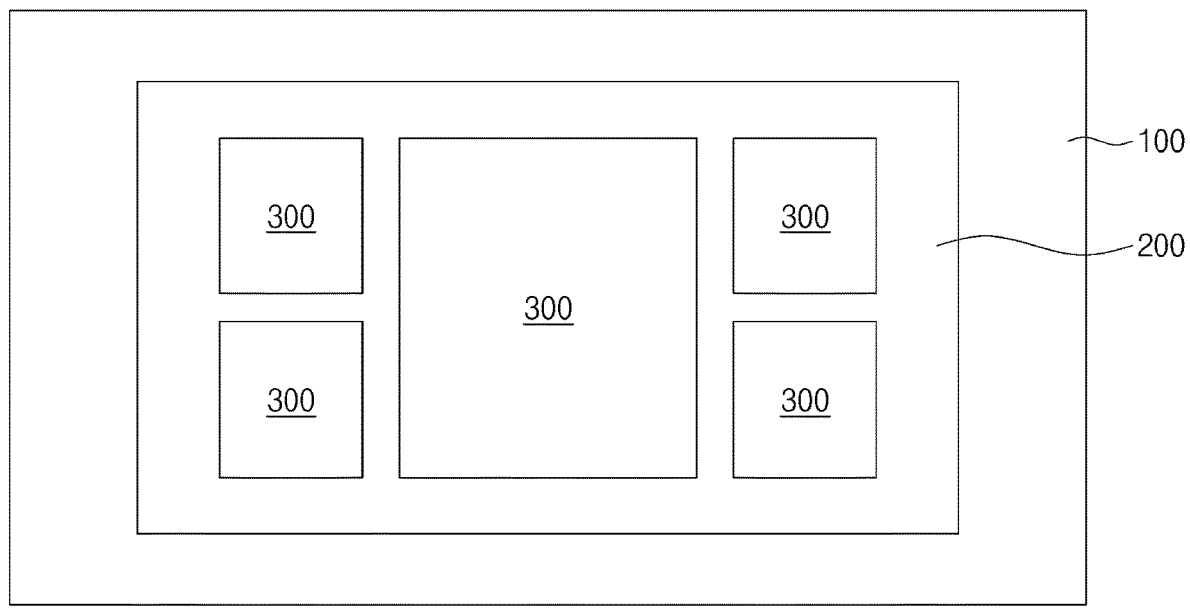
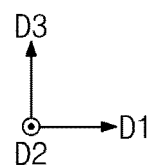

METHOD OF FABRICATING A SEMICONDUCTOR PACKAGE

CROSS-REFERENCE TO RELATED APPLICATION

This U.S. non-provisional patent application claims priority under 35 U.S.C. § 119 to Korean Patent Application No. 10-2020-0085077, filed on Jul. 10, 2020, in the Korean Intellectual Property Office, the entire disclosure of which is incorporated by reference herein.

TECHNICAL FIELD

The present inventive concept relates to a method of fabricating a semiconductor package, and in particular, to a method of fabricating a semiconductor package using a release film

DISCUSSION OF RELATED ART

A semiconductor package is configured to include a semiconductor chip for use as a part of an electronic product. In general, the semiconductor package includes a printed circuit board (PCB) and a semiconductor chip, which is mounted on the PCB and is electrically connected to the PCB by bonding wires or bumps. As the electronics industry advances, there is an increasing demand for electronic devices having small size, light weight, and multi-functional properties.

In some cases, processes for manufacturing semiconductors may include disposing semiconductor chips onto substrates, or separating portions of a substrate by a cutting process to remove the portions for use elsewhere. In order to fasten substrates during these processes, multiple adhesive pieces may be used. These adhesive pieces may leave behind residues when removed, which may cause fabrication failures. Accordingly, there is a need for a method of fabricating a multi-chip package, in which a plurality of chips are mounted in a single semiconductor package, or a system-in-package, in which a plurality of chips of different kinds serving as a single system are mounted with reduced failures.

SUMMARY

An exemplary embodiment of the inventive concept provides a method of fabricating a semiconductor package with reduced steps or process time.

An exemplary embodiment of the inventive concept provides a method of fabricating a semiconductor package with increased reliability.

According to an exemplary embodiment of the inventive concept, a method of fabricating a semiconductor package may include providing a preliminary interposer substrate including connection terminals on a carrier substrate such that the connection terminals are oriented outward, preparing a release film including a base layer, an intermediate layer, and an adhesive layer, attaching the connection terminals to a first surface of the release film, detaching the carrier substrate from the preliminary interposer substrate, cutting the preliminary interposer substrate to form a plurality of interposer substrates, irradiating a first light of a first wavelength onto the release film to form an air gap between the connection terminals and the release film, and detaching the interposer substrates from the release film. The intermediate substrate may include a light absorber absorbing a portion of the first light.

According to an exemplary embodiment of the inventive concept, a method of fabricating a semiconductor package may include providing a preliminary interposer substrate including a preliminary interconnection layer, a preliminary intermediate substrate, and connection terminals on a carrier substrate such that the connection terminals are oriented outward, preparing a release film including a base layer, an intermediate layer, and an adhesive layer, which are sequentially stacked on the connection terminals of the preliminary interposer substrate, attaching the connection terminals to the adhesive layer of the release film, detaching the carrier substrate from the preliminary interposer substrate, cutting the preliminary interposer substrate to form a plurality of interposer substrates separated from each other, irradiating a first light of a first wavelength onto the release film to form an air gap between the connection terminals and the adhesive layer, irradiating a second light of a second wavelength onto the release film, and detaching the interposer substrates from the release film and mounting a plurality of different semiconductor chips on each of the interposer substrates. The adhesive layer of the release film may include a gas foaming agent reacting with the first light and a light curing agent reacting with the second light.

According to an exemplary embodiment of the inventive concept, a method of fabricating a semiconductor package may include providing a preliminary interposer substrate including an interconnection layer, a preliminary intermediate substrate, and connection terminals on a carrier substrate such that the connection terminals are oriented outward, preparing a release film including a base layer, an intermediate substrate, and an adhesive layer, which are sequentially stacked on the connection terminals of the preliminary interposer substrate, attaching the connection terminals to the adhesive layer of the release film, detaching the carrier substrate from the preliminary interposer substrate, cutting the preliminary interposer substrate to form a plurality of interposer substrates separated from each other, irradiating a first light of a first wavelength onto the release film to form an air gap between the connection terminals and the adhesive layer, irradiating a second light of a second wavelength onto the release film, detaching the interposer substrates from the release film, mounting the interposer substrates on lower substrates, respectively, mounting a plurality of semiconductor chips on each of the interposer substrates, and forming a mold layer on each of the interposer substrates to cover the semiconductor chips.

BRIEF DESCRIPTION OF THE DRAWINGS

Example exemplary embodiments will be more clearly understood by describing in detail exemplary embodiments thereof with reference to the accompanying drawings.

FIG. 14 is a plan view illustrating a semiconductor package according to an exemplary embodiment of the inventive concept.

DETAILED DESCRIPTION OF THE EMBODIMENTS

Exemplary embodiments of the inventive concept will now be described more fully with reference to the accompanying drawings.

FIGS. 1 to 7 and FIGS. 10 to 13 are cross-sectional views illustrating a method of fabricating a semiconductor package, according to an exemplary embodiment of the inventive concept. FIGS. 8 and 9 are enlarged cross-sectional views illustrating a region A of FIG. 7.

Figure 1:
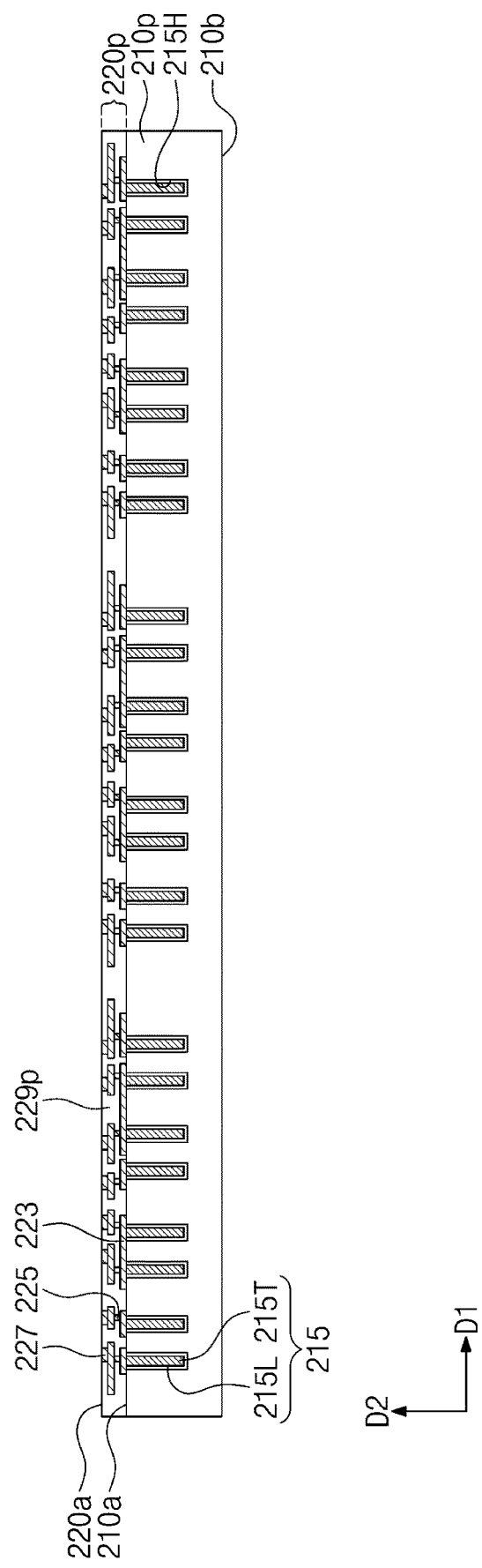
FIGS. 1 to 7 and FIGS. 10 to 13 are cross-sectional views illustrating a method of fabricating a semiconductor package, according to an exemplary embodiment of the inventive concept.

Referring to FIG. 1, a plurality of penetration structures 215 may be formed in a preliminary intermediate substrate 210p. Each of the penetration structures 215 may include a penetration electrode 215T and an insulating liner 215L. In an embodiment, the formation of the penetration structures 215 may include forming penetration holes 215H to penetrate a portion of the preliminary intermediate substrate 210p, forming an insulating liner layer on a first surface 210a of the preliminary intermediate substrate 210p to partially fill each of the penetration holes 215H, forming an electrode layer on the insulating liner layer to fill the remaining portion of each of the penetration holes 215H, and planarizing the electrode layer and the insulating liner layer to expose the first surface 210a of the preliminary intermediate substrate 210p.

Each of the penetration holes 215H may be vertically extended from the first surface 210a of the preliminary intermediate substrate 210p toward a second surface 210b of the preliminary intermediate substrate 210p and may have a depth that does not reach the second surface 210b of the preliminary intermediate substrate 210p. As a result of the planarization process, the plurality of penetration electrodes 215T and the plurality of insulating liners 215L may be locally formed in the penetration holes 215H. The insulating liners 215L may be interposed between the penetration electrodes 215T and a preliminary intermediate substrate 210.

A preliminary interconnection layer 220p may be formed or disposed on the first surface 210a of the preliminary intermediate substrate 210p. For example, the preliminary interconnection layer 220p may be formed or disposed on the preliminary intermediate substrate 210p, the penetration electrodes 215T, and the insulating liners 215L. The preliminary interconnection layer 220p may include interconnection lines 223, vias 225, upper conductive pads 227, and a preliminary insulating layer 229p. The formation of the preliminary interconnection layer 220p may include forming the interconnection lines 223 and the vias 225, which are connected to the penetration electrodes 215T, on the preliminary intermediate substrate 210p, the penetration electrodes 215T, and the insulating liners 215L. The formation of the preliminary interconnection layer 220p may further include forming the upper conductive pads 227 on the interconnection lines 223 and the vias 225, and forming the preliminary insulating layer 229p to cover the upper conductive pads 227, the vias 225 and the interconnection lines 223.

Figure 2:
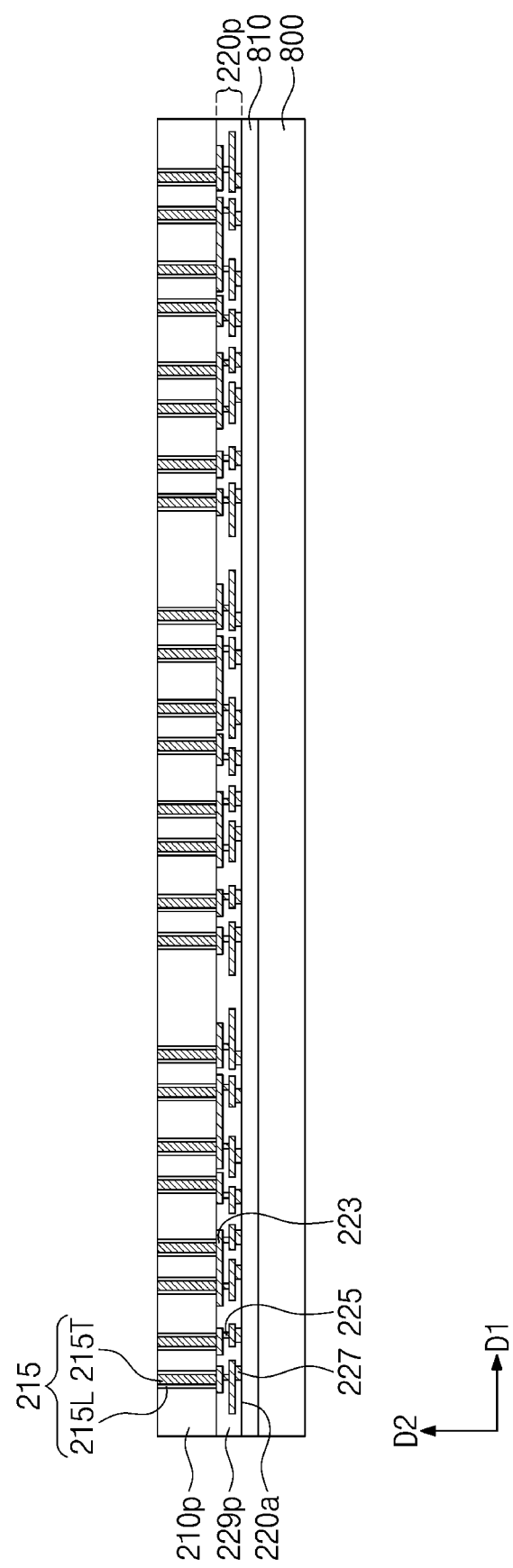

FIG. 2 illustrates a carrier substrate 800 and preparation thereof. The preliminary intermediate substrate 210p and the preliminary interconnection layer 220p may be provided on the carrier substrate 800. In an example embodiment, the preliminary interconnection layer 220p may be disposed in such a way that a first surface 220a thereof faces the carrier substrate 800. The first surface 220a of the preliminary interconnection layer 220p may be opposite to a surface in contact with the preliminary intermediate substrate 210p. A carrier release layer 810 may be interposed between the carrier substrate 800 and the preliminary interconnection layer 220p. The carrier release layer 810 may be used to attach the preliminary interconnection layer 220p to the carrier substrate 800. The carrier substrate 800 may include glass. The carrier release layer 810 may include polymeric materials (e.g., polysiloxane-based compounds).

A grinding process may be performed on the second surface 210b of the preliminary intermediate substrate 210p. The grinding process may be performed to remove an upper portion of the preliminary intermediate substrate 210p, a portion of each of the penetration electrodes 215T, and a portion of each of the insulating liners 215L. Accordingly, a portion of each of the penetration electrodes 215T and an end of each of the insulating liners 215L may be exposed.

Figure 3:
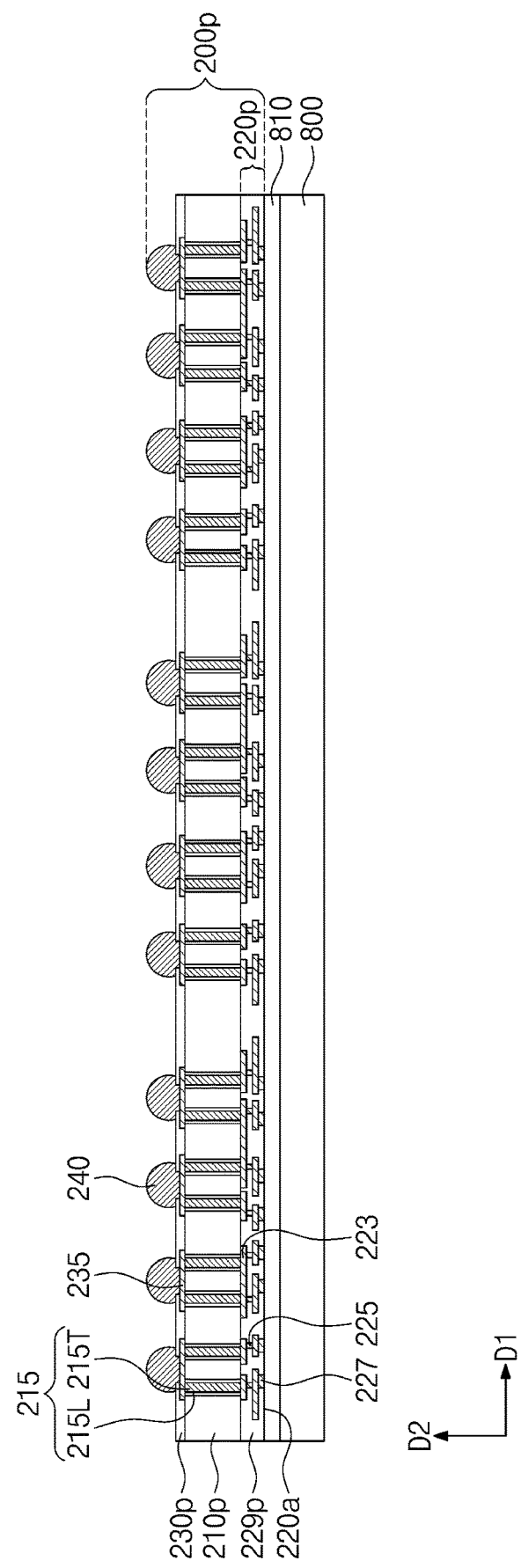

Referring to FIG. 3, a preliminary interposer substrate 200p including connection terminals 240 may be provided on the carrier substrate 800. For example, lower conductive pads 235 may be formed on the grinded surface of the preliminary intermediate substrate 210p. The lower conductive pads 235 may cover the ends of the penetration electrodes 215T. A preliminary buffer layer 230p may be formed on the grinded surface of the preliminary intermediate substrate 210p to cover a portion of each of the lower conductive pads 235. The preliminary buffer layer 230p extend between the lower conductive pads 235 and may be in contact with the preliminary intermediate substrate 210p.

The connection terminals 240 may be formed on the preliminary buffer layer 230p. In an embodiment, the formation of the connection terminals 240 may include partially removing the preliminary buffer layer 230p to form a recess exposing a portion of each of the lower conductive pads 235. Each of the connection terminals 240 may fill the recess and may be connected to a corresponding one of the lower conductive pads 235.

A structure including the preliminary interconnection layer 220p, the preliminary intermediate substrate 210p, the penetration structures 215, the lower conductive pads 235, the preliminary buffer layer 230p, and the connection terminals 240 may be referred to as the preliminary interposer substrate 200p. Accordingly, the preliminary interposer substrate 200p may be provided on the carrier substrate 800 such that the connection terminals 240 are exposed to the outside.

Figure 4:
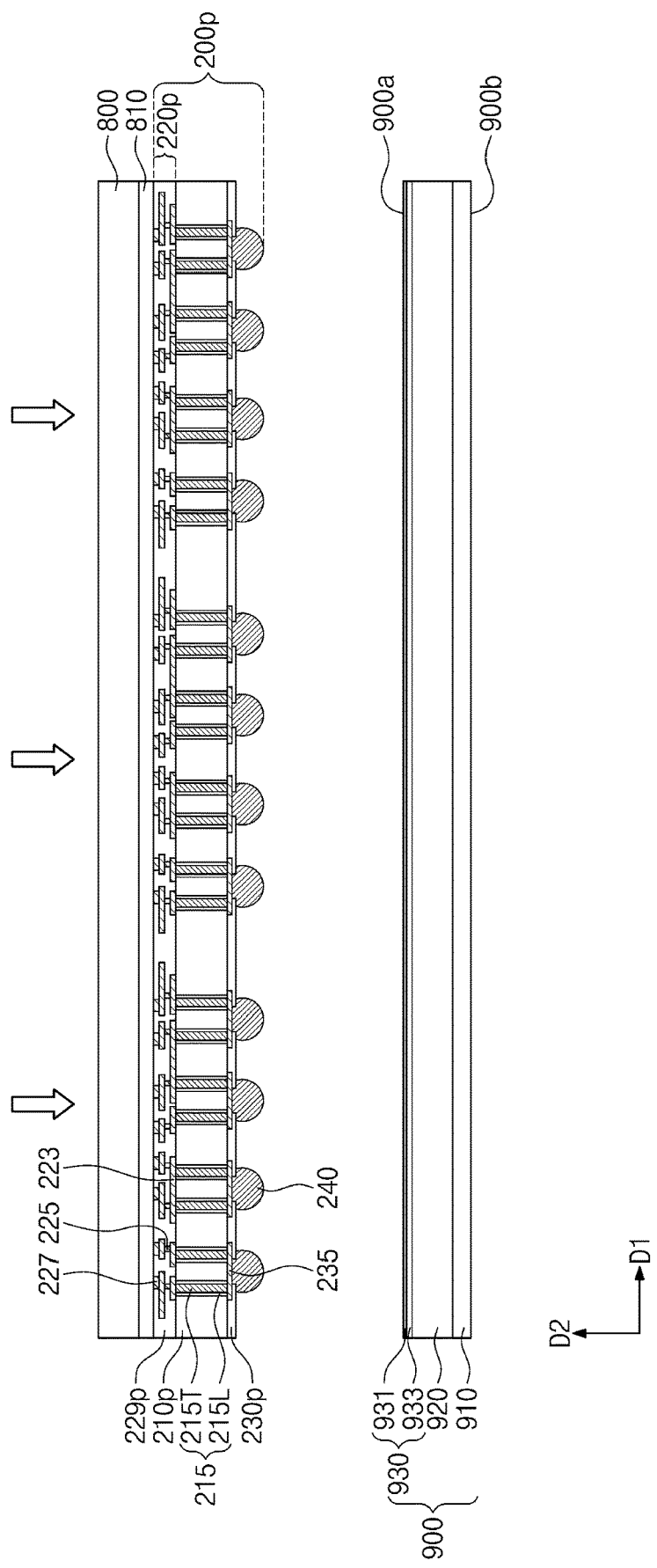

FIG. 4 illustrates a release film 900 and preparation thereof. The release film 900 may include a base layer 910, an intermediate layer 920, and an adhesive layer 930. The adhesive layer 930 may include a first adhesive layer 931 and a second adhesive layer 933. The second adhesive layer 933 may be interposed between the first adhesive layer 931 and the intermediate layer 920.

The base layer 910 may include a single layer or a plurality of stacked layers. The base layer 910 may include polymer. The base layer 910 may include polyolefin (PO), polyethylene terephthalate (PET), poly(1-naphthylamine) (PNA), polyether etherketone (PEEK), and/or polyvinyl alcohol (PVA). A top surface of the base layer 910 may be in contact with the intermediate layer 920, and a bottom surface of the base layer 910 may be a second surface 900b of the release film 900.

The intermediate layer 920 may be provided between the base layer 910 and the adhesive layer 930. The intermediate layer 920 may include acrylate-based compounds. In an example, the intermediate layer 920 may be formed by mixing an acrylate-based compound with a cross-linking agent and crosslinking the compounds. The intermediate layer 920 may further include a light absorber. The light absorber may include chemical compounds containing a conjugated system. The light absorber may include a material given by the following chemical formulae 1, 2, or 3.

[Chemical Formula 1]

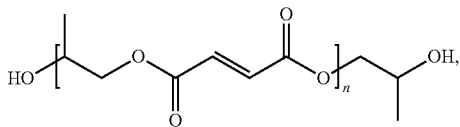

where n is an integer.

[Chemical Formula 2]

where each of R1 and R2 may be a hydrogen, a halogen, a linear or branched alkyl group having 1-5 carbon atoms, a carbonyl group, an ester group, an acetate group, an amide group, or a substituted or unsubstituted phenyl group having 6-13 carbon atoms.

[Chemical Formula 3]

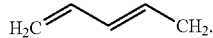

The light absorber in the intermediate layer 920 may absorb light of a specific wavelength. By adjusting the composition of the light absorber, it may be possible to control transmittance of the intermediate layer 920 to light of the specific wavelength. Further, by adjusting the composition of the light absorber, it may be possible to choose a wavelength range of light penetrating the intermediate layer 920.

The adhesive layer 930 may include the first adhesive layer 931 and the second adhesive layer 933. The first adhesive layer 931 may be provided on a top surface of the second adhesive layer 933. The first adhesive layer 931 may cover the top surface of the second adhesive layer 933. A top surface of the first adhesive layer 931 may be a first surface 900a of the release film 900. The first adhesive layer 931 may include silicon. For example, the first adhesive layer 931 may include at least one of polysiloxane-based compounds. The first adhesive layer 931 may be used capture a first gas, which will be described below, in a region between the first surface 900a of the release film 900 and the connection terminal 240.

The second adhesive layer 933 may be disposed between the first adhesive layer 931 and the intermediate layer 920. The second adhesive layer 933 may include at least one acrylate-based compound. In an example, the second adhesive layer 933 may be formed by mixing an acrylate-based compound with a cross-linking agent and performing a cross-linking reaction. In an embodiment, the cross-linking reaction may be performed under a heating condition. The cross-linking agent may include, for example, aromatic diisocyanate or aliphatic diisocyanate. The second adhesive layer 933 may further include a light curing agent. The light curing agent may be a photo-initiator. In an example embodiment, the light curing agent may include at least one of, an azo compound, azobisisobutyronitrile (AIBN), or benzoyl peroxide. The light curing agent may react with a light of a specific wavelength to cure the second adhesive layer 933. In an example, the light curing agent may produce radicals capable of initiating a radical polymerization process when irradiated by light of the specific wavelength. The second adhesive layer 933 may be cured as a result of a chemical reaction caused by the radicals.

The second adhesive layer 933 may further include a gas foaming agent. In the case where the gas foaming agent is irradiated with the light of the specific wavelength, a first gas may be produced. In an embodiment, the gas foaming agent may produce a nitrogen gas when light of 300 nm wavelength is irradiated thereto. For example, the gas foaming agent may include at least one of acyl azide, triazole, tetrazole, tetrazolone, diazonium salt, diazirine, or diazo compound.

The preliminary interposer substrate 200p may be attached to the release film 900. The attachment of the preliminary interposer substrate 200p to the release film 900 may include placing the preliminary interposer substrate 200p on the release film 900 and then pressing the preliminary interposer substrate 200p to bring the connection terminals 240 of the preliminary interposer substrate 200p into contact with the adhesive layer 930.

The preliminary interposer substrate 200p may be disposed on the adhesive layer 930. Here, the connection terminals 240 of the preliminary interposer substrate 200p may be oriented toward the first surface 900a of the release film 900. The preliminary interposer substrate 200p may be attached to the adhesive layer 930 of the release film 900 by pressure exerted on the preliminary interposer substrate 200p. In an example, the connection terminals 240 of the preliminary interposer substrate 200p may be in contact with the adhesive layer 930. The adhesive layer 930 may enclose the connection terminals 240 and may deform along curved surfaces of the connection terminals 240.

Figure 5:
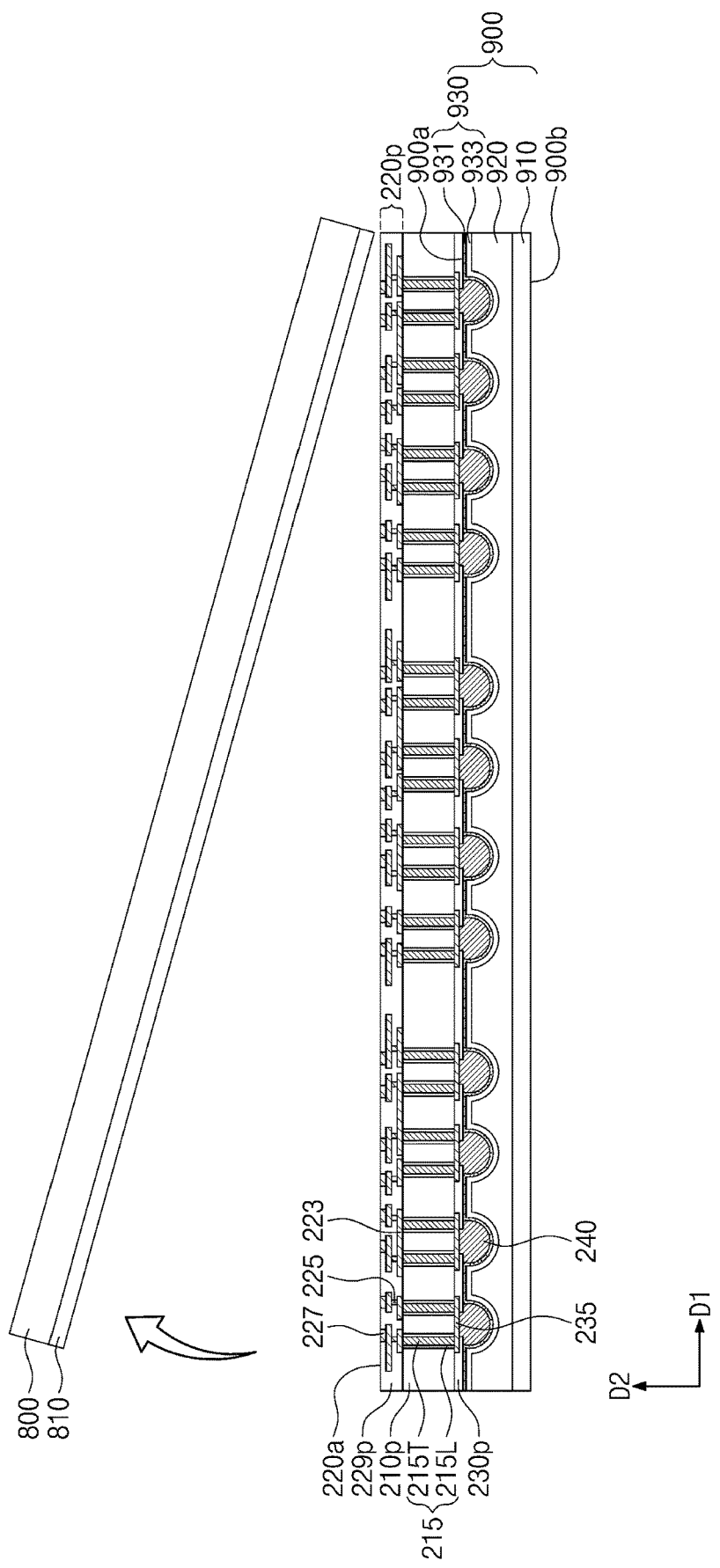

Referring to FIG. 5, the carrier substrate 800 provided on the preliminary interposer substrate 200p may be removed. In an example, light or heat may be applied to the carrier release layer 810 to weaken adhesion of the carrier release layer 810. Accordingly, the carrier release layer 810 may be detached from the preliminary interposer substrate 200p. When the carrier substrate 800 is removed, the release film 900 may fasten the preliminary interposer substrate 200p, and the removal process may be stably performed.

Figure 6:
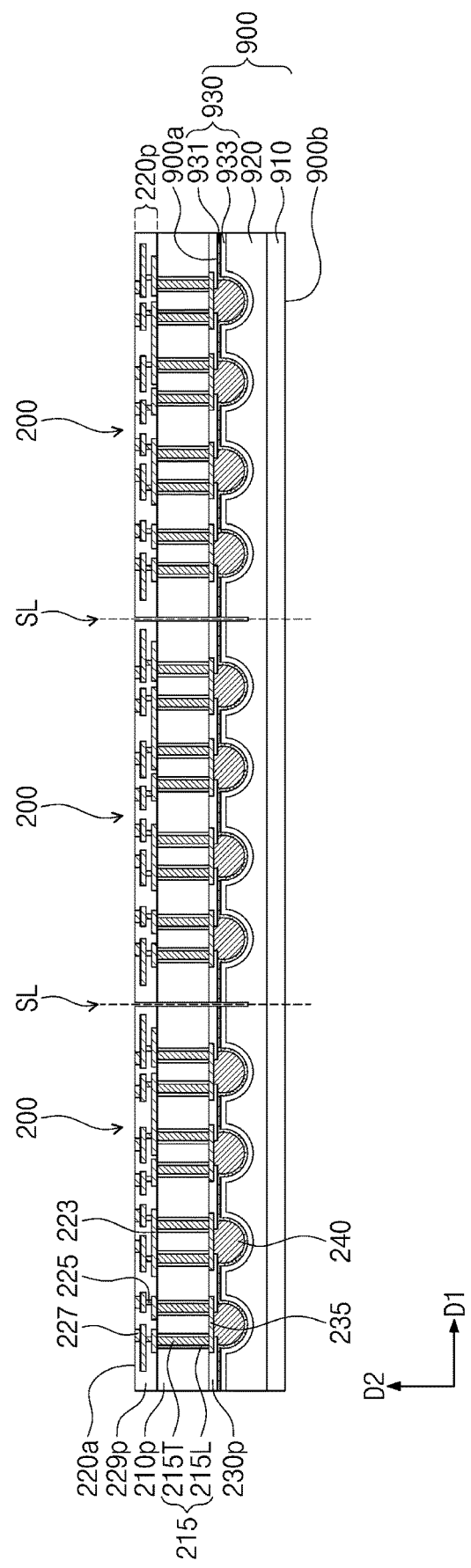

Referring to FIG. 6, a plurality of interposer substrates 200 may be formed by cutting the preliminary interposer substrate 200p. The formation of the interposer substrates 200 may include sawing or cutting the preliminary insulating layer 229p, the preliminary intermediate substrate 210p, and the preliminary buffer layer 230p along a sawing line SL. As a result, the interposer substrates 200 may be separated from each other. In an embodiment, when the preliminary interposer substrate 200p is cut, the release film 900 may be partially cut. However, an entire length of the release film 900 may not be cut by the sawing process.

Figure 7:
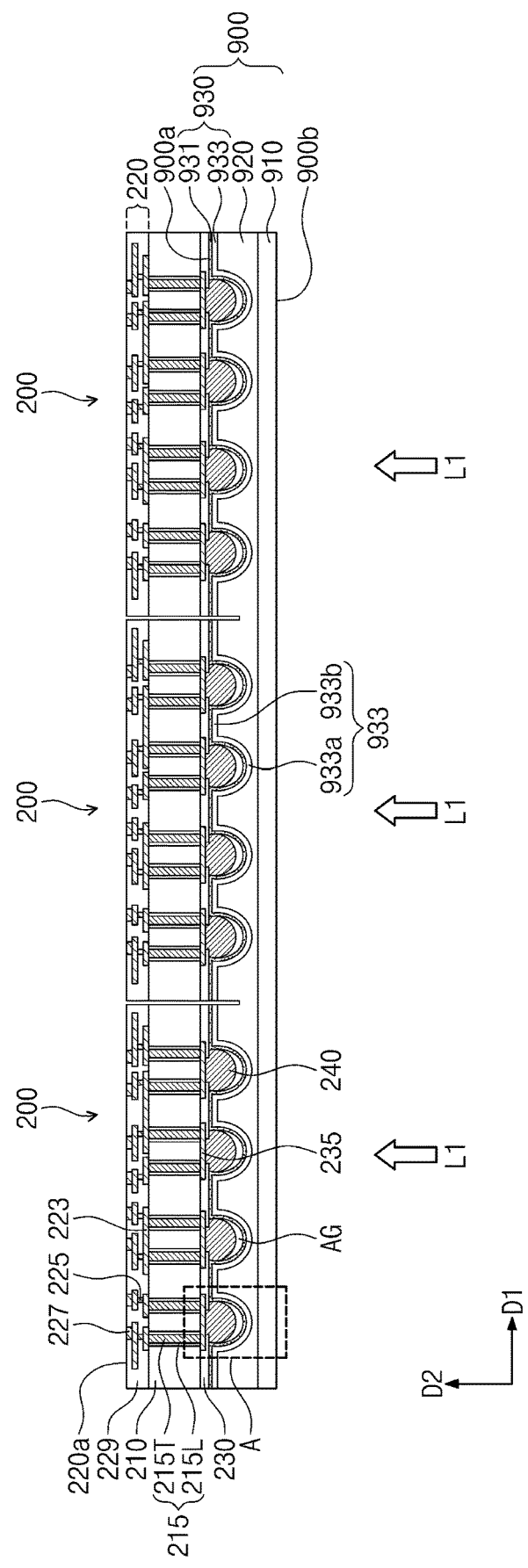
Figure 8:
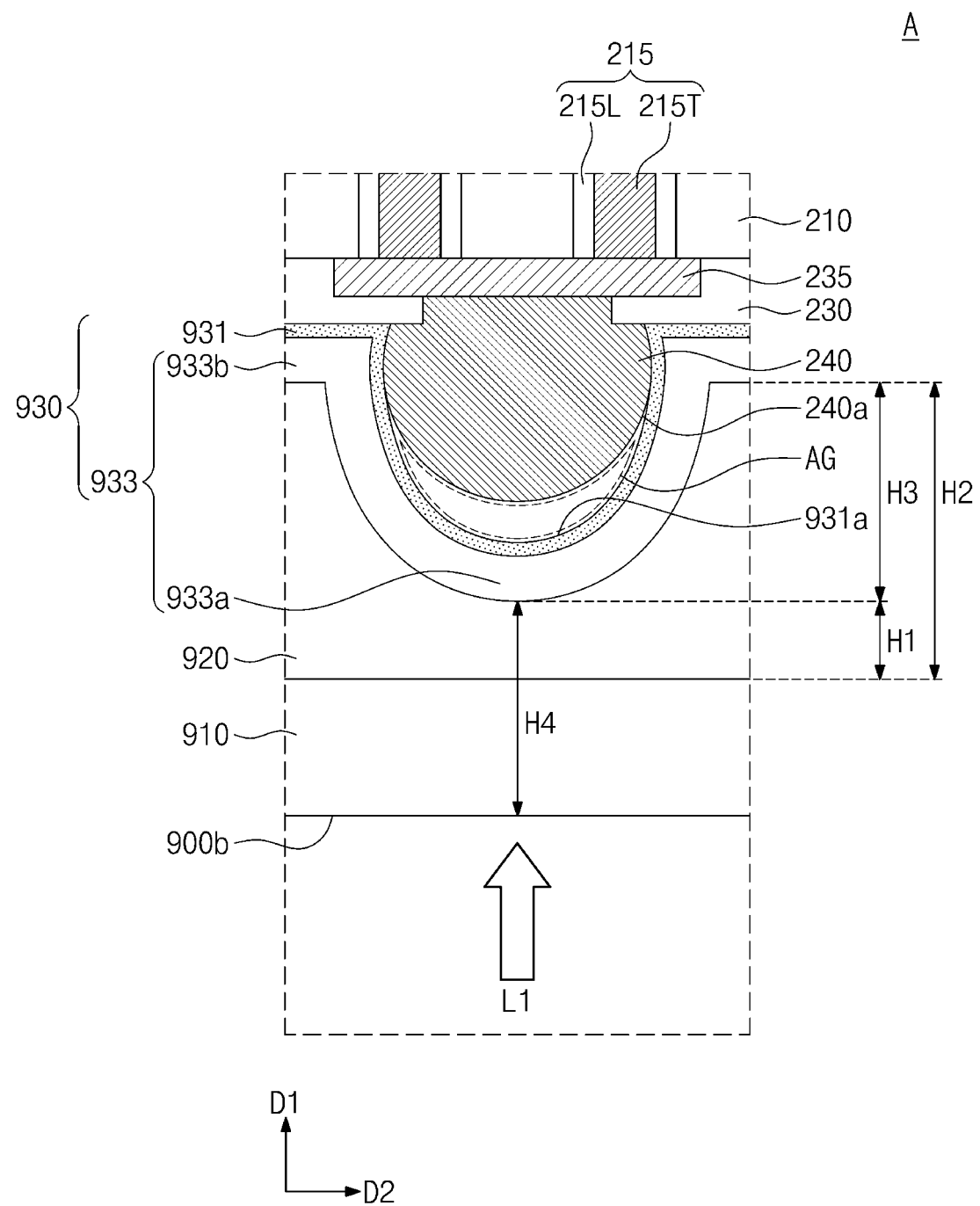
FIGS. 8 and 9 are enlarged cross-sectional views illustrating a region A of FIG. 7.
Figure 9:
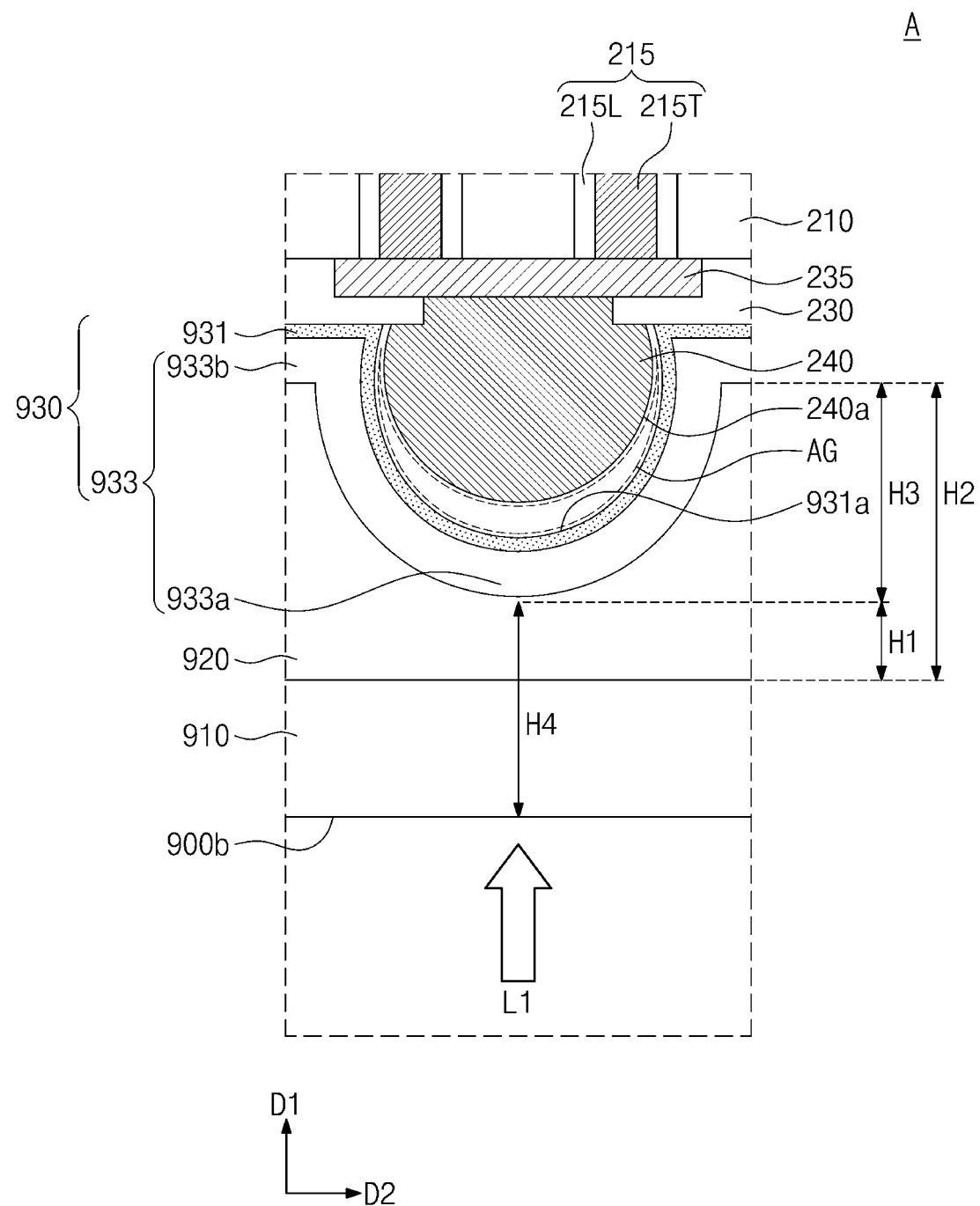

Referring to FIGS. 7 to 9, a first light L1 of a first wavelength may be irradiated onto the second surface 900b of the release film 900 to form an air gap AG between each of the connection terminals 240 and the release film 900. The formation of the air gap AG may include irradiating the first light L1 onto the second surface 900b of the release film 900 to expose the adhesive layer 930 to the first light L1. In an example, a gas foaming agent in the adhesive layer 930 may react with the first light L1 to produce a first gas, and the first gas may be captured in a region between the adhesive layer 930 and each of the connection terminals 240 to form the air gap AG.

The first light L1 of the first wavelength may be irradiated onto the second surface 900b of the release film 900. The first light L1 may be irradiated onto the entire region of the second surface 900b of the release film 900. The first light L1 may be ultraviolet light; for example, the first wavelength may range from 200 nm to 400 nm.

The first light L1, which is irradiated onto the second surface 900b of the release film 900, may be incident into the adhesive layer 930 through the base layer 910 and the intermediate layer 920. In an embodiment, the intermediate layer 920 may include a light absorber absorbing the first light L1 of the first wavelength. A portion of the first light L1 may be absorbed by the light absorber while passing through the intermediate layer 920, and thus, a first amount of first light L1 incident to the adhesive layer 930 through the intermediate layer 920 may be less a second amount of the first light L1 irradiated onto the second surface 900b.

In detail, referring to FIG. 8, the second adhesive layer 933 may include a first portion 933a, which encloses the connection terminal 240, and a second portion 933b, which extends parallel to a buffer layer 230. Due to the presence of the connection terminal 240, the first portion 933a of the second adhesive layer 933 may have a convex shape protruding toward the second surface 900b of the release film 900. A vertical distance H4 from the second surface 900b of the release film 900 to the first portion 933a may range from 20 μm to 50 μm. In an example, a thickness H1 of the intermediate layer 920 provided between the first portion 933a and the base layer 910 may be smaller than a thickness H2 of the intermediate layer 920 provided between the second portion 933b and the base layer 910. A difference H3 between the thickness H1 of the intermediate layer 920 provided between the first portion 933a and the base layer 910 and the thickness H2 of the intermediate layer 920 provided between the second portion 933b and the base layer 910 may range from 20 μm to 200 μm.

The first light L1 may pass through the intermediate layer 920 and may be absorbed by the light absorber. Accordingly, as the length of the optical path of the first light L1 passing through the intermediate layer 920 increases, the amount of the first light L1 incident into the second adhesive layer 933 decreases. The length of the optical path of the first light L1 passing through the intermediate layer 920 may depend on a thickness of the intermediate layer 920. For example, the smaller the thickness of the intermediate layer 920, the larger the light amount of the first light L1 incident into the second adhesive layer 933. For example, transmittance of the first light L1 in the intermediate layer 920 provided between the first portion 933a and the base layer 910 may be higher than transmittance of the first light L1 in the intermediate layer 920 provided between the second portion 933b and the base layer 910. In an embodiment, by changing the composition of the light absorber, it may be possible to allow the first light L1 to be incident into the first portion 933a of the second adhesive layer 933 and to substantially prevent the first light L1 from transmitting into the second portion 933b of the second adhesive layer 933. Accordingly, the light amount of the first light L1 incident into the first portion 933a of the adhesive layer 930 may be greater than the light amount of the first light L1 incident into the second portion 933b of the adhesive layer 930.

If the first light L1 is incident into the second adhesive layer 933 through the intermediate layer 920, the first light L1 may react with the gas foaming agent in the second adhesive layer 933 to form a first gas. For example, the gas foaming agent may be decomposed by the first light L1 to produce the first gas. The first gas may be changed depending on the kind of the gas foaming agent and, for example, may include nitrogen. According to an exemplary embodiment of the inventive concept, since the amount of the first light L1 incident into the first portion 933a of the second adhesive layer 933 is greater than the amount of the first light L1 incident into the second portion 933b, the first gas may be produced near the first portion 933a.

The first adhesive layer 931 may be used to capture the first gas, which is produced near the first portion 933a of the second adhesive layer 933, in a region between the connection terminal 240 and the first adhesive layer 931. Accordingly, the air gap AG may be formed between a curved surface 240a of the connection terminal 240 and a top surface 931a of the first adhesive layer 931. As shown in FIG. 8, at an initial stage of the formation of the air gap AG, the air gap AG may be interposed between the lowermost surface of the connection terminal 240 and the first adhesive layer 931, and thus, the first adhesive layer 931 may be still in contact with a portion of the surface 240a of the connection terminal 240. However, referring to FIG. 9, if the first gas is sufficiently produced, the air gap AG may be expanded to fully enclose the connection terminal 240. Accordingly, the surface 240a of the connection terminal 240 may be spaced apart from a top surface 940a of the first adhesive layer 931.

In a process of fabricating a semiconductor package, a release film may be attached to a substrate to fasten the substrate, when a cutting process is performed on the substrate. In the case where a connection terminal protruding from a surface of the substrate is in contact with the release film during a cutting process, each piece of the cut substrate may not be able to clearly separate from the release film. Accordingly, a residue of the release film may be left on the cut substrate. The residue may lead to a failure in a process of fabricating the semiconductor package. By contrast, according to an exemplary embodiment of the inventive concept, the release film 900 fastening the preliminary interposer substrate 200p may be prepared before the cutting process. The release film 900 may include the intermediate layer 920, in which a light absorber absorbing the first light L1 is contained, and the adhesive layer 930, in which a gas foaming agent and a light curing agent are contained. The light absorber in the intermediate layer 920 may absorb the first light L1, and it may be possible to selectively control a light amount of the first light L1 incident into the adhesive layer 930. Accordingly, a first gas may be produced by a reaction between the first light L1 and the gas foaming agent in the adhesive layer 930. The first gas may enclose the connection terminal 240 and may form the air gap AG. Due to the presence of the air gap AG, the release film 900, which is provided on the connection terminals 240 with curved surfaces, may be clearly removed, and it may be possible to reduce process failures in the fabrication process.

In general, a fastening film used for a debonding process of a carrier substrate may be different from a fastening film used for a cutting process. By contrast, according to an exemplary embodiment of the inventive concept, the release film 900 may be used to fasten the preliminary interposer substrate 200p in processes of both cutting the preliminary interposer substrate 200p and of debonding the carrier substrate 800. Accordingly, it is possible to reduce process time and the number of process steps, and thereby reduce fabrication cost.

Figure 10:
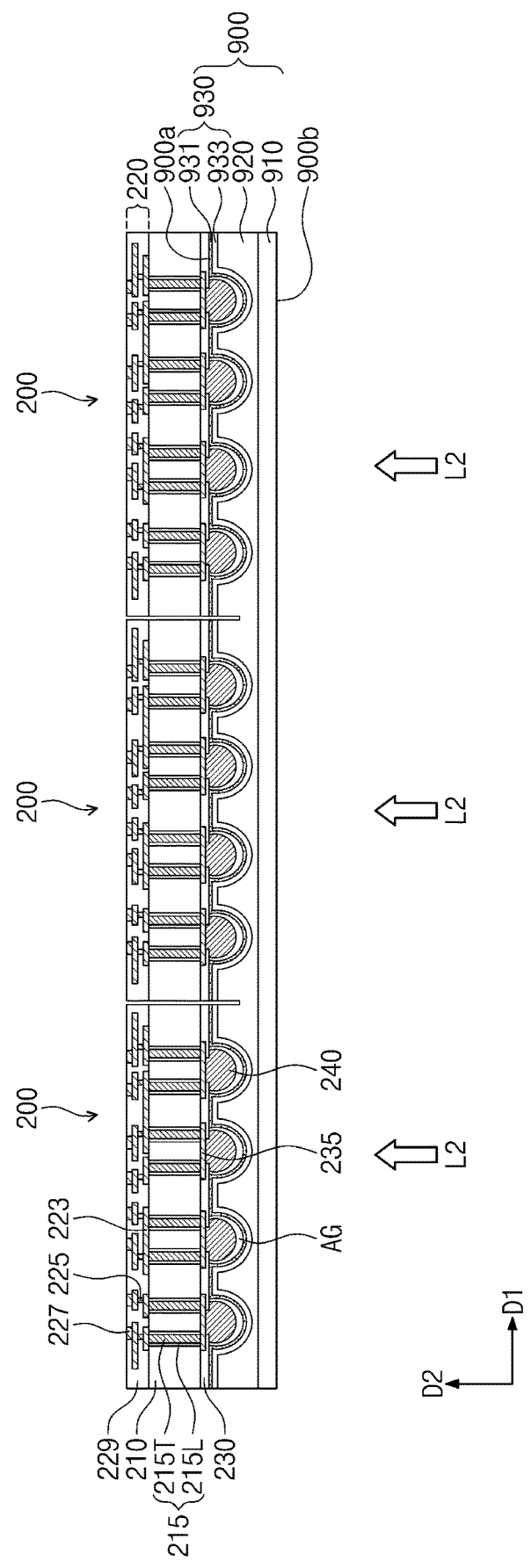

Referring to FIG. 10, a second light L2 of a second wavelength may be irradiated onto the second surface 900b of the release film 900. The irradiation of the second light L2 of the second wavelength onto the second surface 900b of the release film 900 may include providing the second light L2 to the adhesive layer 930 through the intermediate layer 920 and curing the adhesive layer 930 through reaction between the second light L2 and the light curing agent in the adhesive layer 930.

The second light L2 may be irradiated onto the entire region of the second surface 900b of the release film 900. The second light L2 may be ultraviolet light; for example, the second wavelength may range from 200 nm to 400 nm. The second wavelength may be different from the first wavelength. The second light L2 may be incident into the adhesive layer 930 through the base layer 910 and the intermediate layer 920. The adhesive layer 930 may include a light curing agent that can react with the second light. The second light L2 incident into the adhesive layer 930 may react with the light curing agent in the adhesive layer 930 to cure the adhesive layer 930. Accordingly, adhesion between the adhesive layer 930 and the buffer layer 230 may be reduced, and the interposer substrate 200 may be detached from the release film 900.

Figure 11:
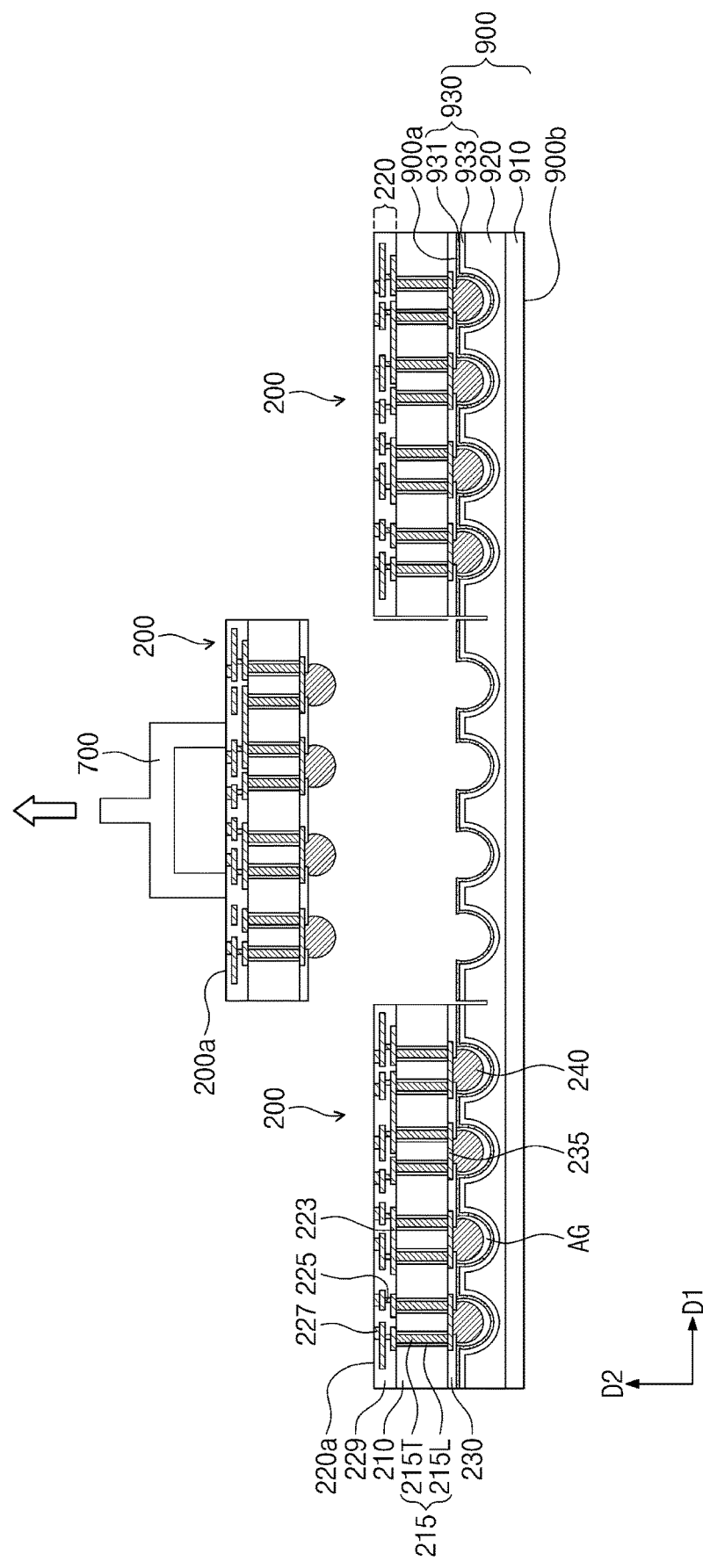

Referring to FIG. 11, the interposer substrate 200 may be detached from the release film 900 by using a chip collector 700. The chip collector 700 may be provided on a top surface 200a of the interposer substrate 200. The chip collector 700 may be attached to the top surface 200a of the interposer substrate 200 and may be used to lift the interposer substrate 200. Accordingly, the interposer substrate 200 may be separated from the release film 900 in a second direction D2. Thereafter, the chip collector 700 may move interposer substrate 200 to a desired position.

Figure 12:
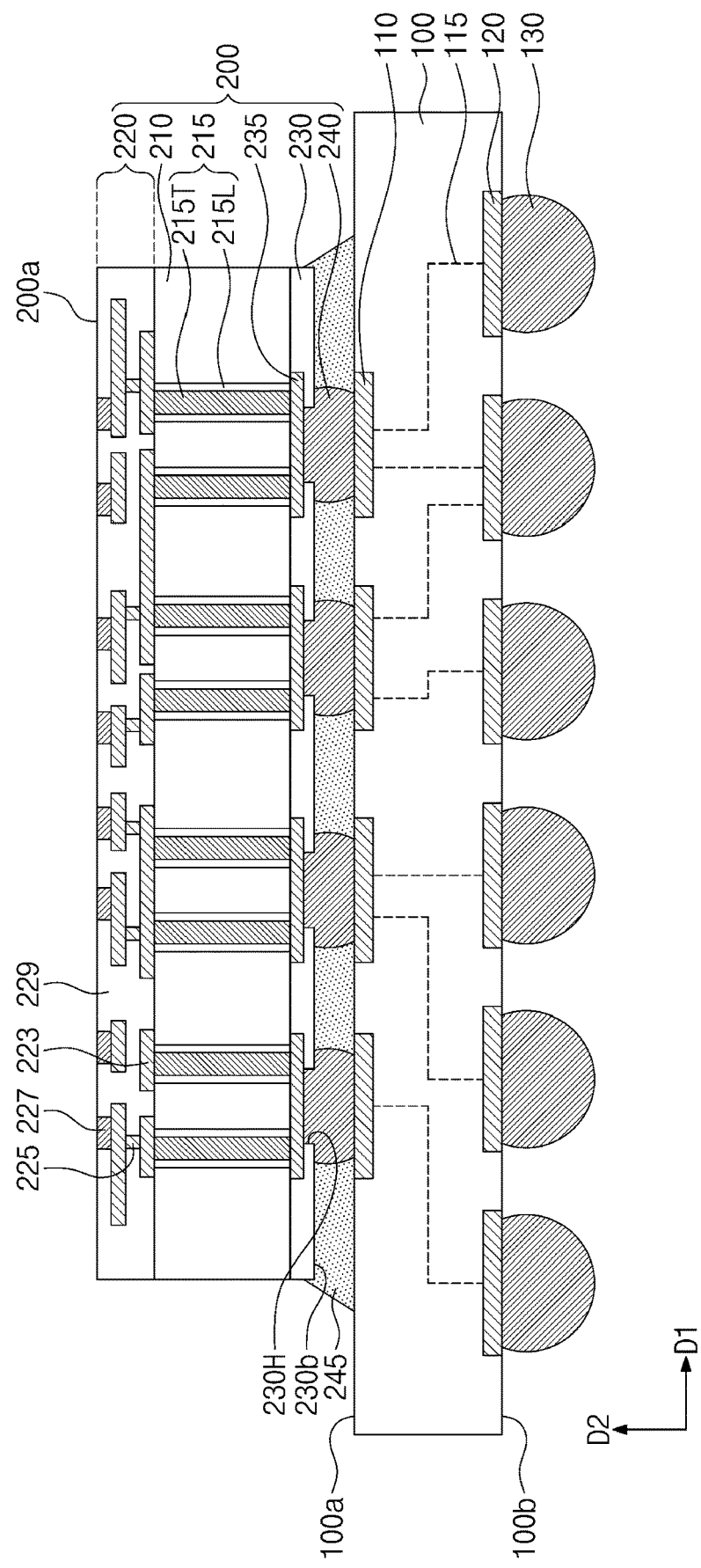

Referring to FIG. 12, a lower substrate 100 may be prepared. The lower substrate 100 may include first lower substrate pads 110, which are adjacent to a top surface 100a of the lower substrate 100, and second lower substrate pads 120, which are adjacent to a bottom surface 100b of the lower substrate 100. The interposer substrate 200 may be disposed on the lower substrate 100 such that a bottom surface 230b of the buffer layer 230 faces the top surface 100a of the lower substrate 100. Each of the connection terminals 240 may be connected to a corresponding one of the first lower substrate pads 110.

A lower under-fill layer 245 may be formed between the lower substrate 100 and the buffer layer 230. The lower under-fill layer 245 may be formed to fill a space between the connection terminals 240. Outer terminals 130 may be disposed on a bottom surface 100b of the lower substrate 100 and may be connected to the second lower substrate pads 120, respectively.

Figure 13:
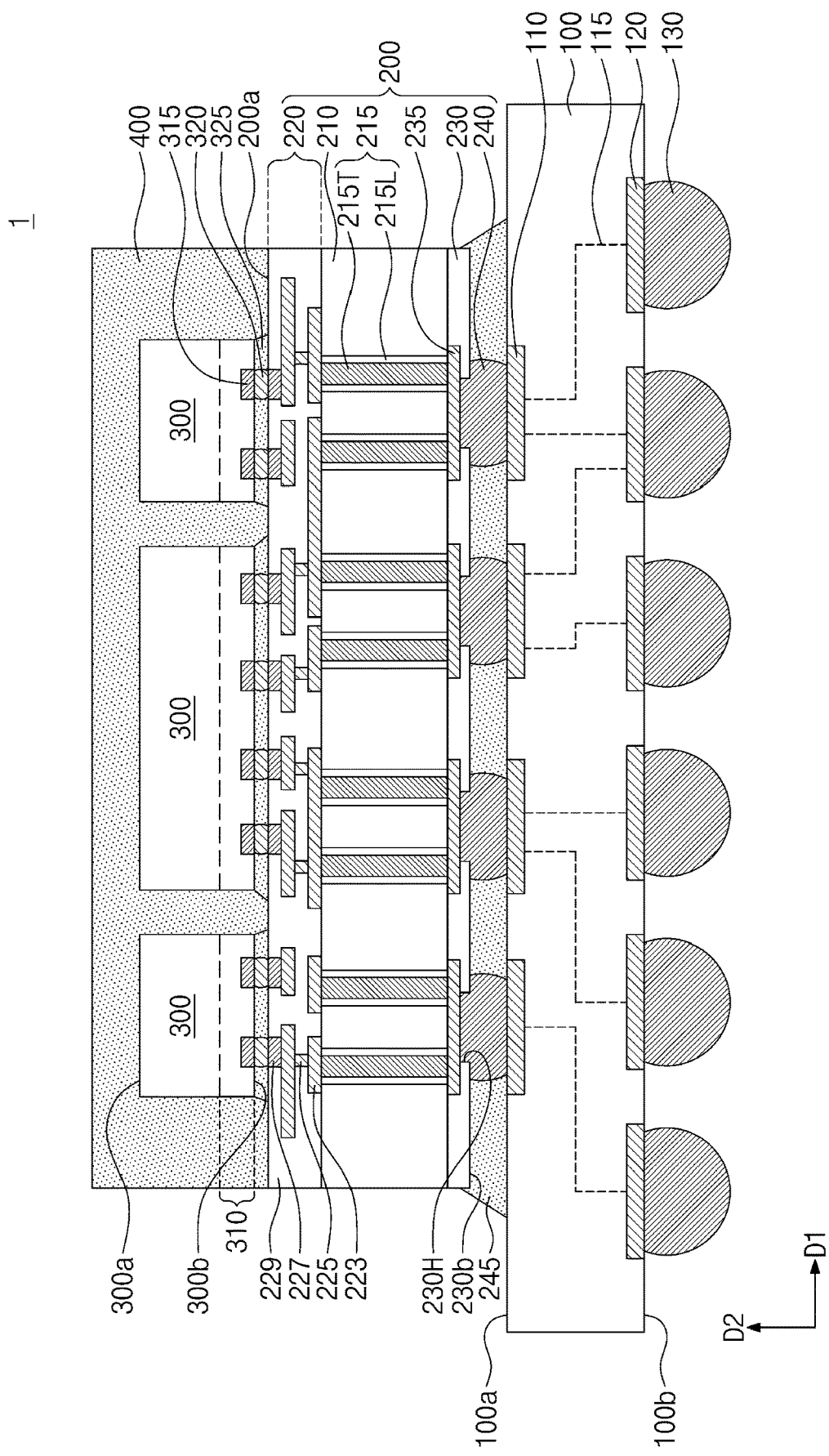

Referring to FIG. 13, a plurality of semiconductor chips 300 may be disposed on the top surface 200a of the interposer substrate 200 and may be mounted on an interconnection layer 220. Each of the semiconductor chips 300 may be mounted on the interconnection layer 220 of the interposer substrate 200. Each of the semiconductor chips 300 may include chip pads 315, which are disposed adjacent to a surface 300b of each of the semiconductor chips 300. Each of the semiconductor chips 300 may be provided on the interconnection layer 220 such that the chip pads 315 are in contact with corresponding chip connection terminals 320. The semiconductor chips 300 disposed such that they are horizontally spaced apart from each other.

The semiconductor package according to an embodiment of the inventive concept may be fabricated by the methods disclosed herein.

FIG. 14 is a plan view illustrating a semiconductor package according to an embodiment of the inventive concept. Hereinafter, the semiconductor package will be described in more detail with reference to FIGS. 13 and 14.

Referring to FIGS. 13 and 14, a semiconductor package 1 may include the lower substrate 100, the interposer substrate 200, the lower under-fill layer 245, and the semiconductor chips 300.

The lower substrate 100 may have the top surface 100a and the bottom surface 100b opposite to each other. The lower substrate 100 may include the first lower substrate pads 110, which are provided adjacent to the top surface 100a of the lower substrate 100, the second lower substrate pads 120, which are provided adjacent to the bottom surface 100b of the lower substrate 100, and lower substrate interconnection lines 115, which electrically connect the first lower substrate pads 110 to the second lower substrate pads 120. The first lower substrate pads 110, the second lower substrate pads 120, and the lower substrate interconnection lines 115 may include a conductive material. In an embodiment, the lower substrate 100 may be a printed circuit board (PCB). The outer terminals 130 may be disposed on the bottom surface 100b of the lower substrate 100 and may be connected to the second lower substrate pads 120.

The interposer substrate 200 may be disposed on the top surface 100a of the lower substrate 100. The interposer substrate 200 may include the interconnection layer 220, an intermediate substrate 210, the penetration structures 215, the lower conductive pads 235, the buffer layer 230, and the connection terminals 240.

The interconnection layer 220 may be provided on the intermediate substrate 210 and the penetration structures 215. The interconnection layer 220 may include the interconnection lines 223, which are provided on the top surface of the intermediate substrate 210 and the top surface of each of the penetration structures 215, the vias 225, which are connected to the interconnection lines 223, the upper conductive pads 227, which are provided on the interconnection lines 223 and the vias 225, and an insulating layer 229 that covers the interconnection lines 223, the vias 225, and the upper conductive pads 227. The topmost interconnection lines 223 may be connected to the upper conductive pads 227, and the insulating layer 229 may expose top surfaces of the upper conductive pads 227.

The intermediate substrate 210 may be interposed between the buffer layer 230 and the interconnection layer 220. In an embodiment, the intermediate substrate 210 may be a silicon substrate. The penetration structures 215 may be disposed in the intermediate substrate 210. Each of the penetration structures 215 may include the penetration electrode 215T and the insulating liner 215L. The penetration electrode 215T may penetrate the intermediate substrate 210 and may be connected to the lowermost interconnection lines 223. The penetration electrode 215T may include at least one conductive material (e.g., copper). The insulating liner 215L may be interposed between the penetration electrode 215T and the intermediate substrate 210. The insulating liner 215L may include at least one insulating material (e.g., silicon oxide and/or silicon nitride).

The lower conductive pads 235 may be provided on the bottom surfaces of the penetration structures 215. The lower conductive pads 235 may be vertically overlapped with the penetration structures 215. Each of the lower conductive pads 235 may be connected to at least one of the penetration structures 215. The lower conductive pads 235 may include a conductive material (e.g., copper). The buffer layer 230 may cover a bottom surface of the intermediate substrate 210, which is not covered with the lower conductive pads 235. The buffer layer 230 may include openings 230H, each of which is formed to partially expose a corresponding one of the lower conductive pads 235. The buffer layer 230 may include an insulating material. For example, the buffer layer 230 may include a photo-sensitive insulating dielectric (PID).

The connection terminals 240 may be provided between the lower conductive pads 235 and the top surface 100a of the lower substrate 100. Each of the connection terminals 240 may be extended into the opening 230H of the buffer layer 230 to cover an inner side surface of the opening 230H and may be connected to a corresponding one of the lower conductive pads 235. Each of the connection terminals 240 may be electrically connected to a corresponding one of the penetration electrodes 215T through a corresponding one of the lower conductive pads 235. The connection terminals 240 may include at least one conductive material and may be provided in the form of solder balls, solder bumps, and pillars.

The lower under-fill layer 245 may be interposed between the lower substrate 100 and the buffer layer 230 and may fill a gap region between the connection terminals 240. The lower under-fill layer 245 may include an insulating polymer material (e.g., epoxy resin).

The semiconductor chips 300 may be disposed on the interconnection layer 220 of the interposer substrate 200. The semiconductor chips 300 may be spaced apart from each other in both of first and second directions D1 and D2. The first direction D1 may be parallel to the top surface 100a of the lower substrate 100, and the second direction D2 may be perpendicular to the top surface 100a of the lower substrate 100. A third direction D3 may be parallel to the top surface 100a of the lower substrate 100 and perpendicular to the first direction D1. The surface 300b of each of the semiconductor chips 300 may face the top surface 200a of the interposer substrate 200. Each of the semiconductor chips 300 may include a circuit layer 310 located adjacent to the surface 300b of each of the semiconductor chips 300. The circuit layer 310 may include integrated circuits.

Each of the semiconductor chips 300 may include a logic chip, an application processor (AP) chip, a system-on-chip (SOC), or a memory chip, though the present inventive concept is not limited thereto. For example, some of the semiconductor chips 300 may be logic chips, application processor (AP) chips, or system-on-chips (SOCs), and others of the semiconductor chips 300 may be memory chips. The memory chips may be high bandwidth memory (HBM) chips, in which memory chips of the same kind are stacked.

Each of the semiconductor chips 300 may include the chip pads 315, which are provided adjacent to the surface 300b thereof. The chip pads 315 may include at least one conductive material. The chip pads 315 may be connected to the upper conductive pads 227, respectively.

In an embodiment, the chip connection terminals 320 may be interposed between the chip pads 315 and the upper conductive pads 227. Each of the chip pads 315 may be connected to a corresponding upper conductive pad 227 through a corresponding chip connection terminal 320. The chip connection terminals 320 may include a conductive material and may be provided in the form of at least one of solder balls, solder bumps, and pillars.

A chip under-fill layer 325 may be disposed between the surface 300b of each of the semiconductor chips 300 and the interconnection layer 220. The chip under-fill layer 325 may be disposed on the surface 300b of each of the semiconductor chips 300 and may fill a gap region between the chip connection terminals 320. The chip under-fill layer 325 may include an insulating polymer material (e.g., epoxy resin). In an embodiment, the chip connection terminals 320 and the chip under-fill layer 325 may be omitted. In this case, the chip pads 315 may be in contact with the corresponding upper conductive pads 227 and may be directly bonded to the upper conductive pads 227.

In an embodiment, the semiconductor package 1 may further include a mold layer 400 disposed on the top surface 200a of the interposer substrate 200. The mold layer 400 may be disposed on the interconnection layer 220 to cover the semiconductor chips 300. The mold layer 400 may include at least one insulating material (e.g., epoxy molding compounds).

Figure 15:
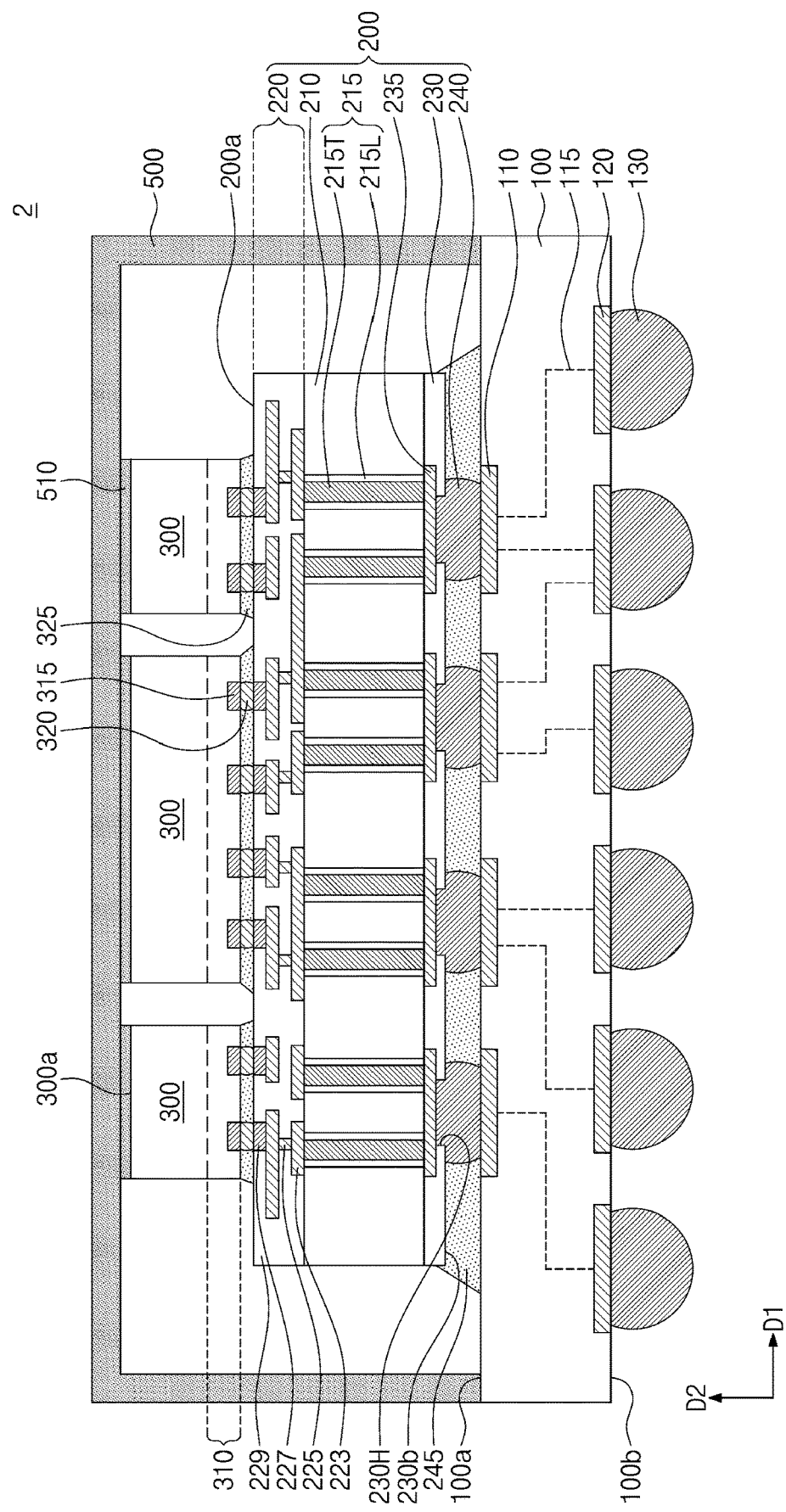
FIG. 15 is a cross-sectional view illustrating a semiconductor package according to an exemplary embodiment of the inventive concept.

FIG. 15 is a cross-sectional view illustrating a semiconductor package according to an exemplary embodiment of the inventive concept. For concise description, a previously described element may be identified by the same reference number without repeating an overlapping description thereof.

Referring to FIG. 15, a semiconductor package 2 may include the lower substrate 100, the interposer substrate 200, the lower under-fill layer 245, and the semiconductor chips 300. The lower substrate 100, the interposer substrate 200, the lower under-fill layer 245, and the semiconductor chips 300 may be configured to have substantially the same features as those of FIG. 14.

In an embodiment, the semiconductor package 2 may further include a heat-dissipation structure 500 provided on the lower substrate 100. The heat-dissipation structure 500 may be disposed on the top surface 100a of the lower substrate 100. In an embodiment, the interposer substrate 200 and the semiconductor chips 300, which have been described with reference to FIGS. 13 and 14, may be disposed in the heat-dissipation structure 500. The heat-dissipation structure 500 may include at least one thermally-conductive material. The thermally-conductive materials may include metallic materials (e.g., copper, aluminum, and so forth) or carbon-containing materials (e.g., graphene, graphite, carbon nanotube, and so forth). For example, the heat-dissipation structure 500 may include a single metal layer or a plurality of stacked metal layers. In another example, the heat-dissipation structure 500 may include a heat sink or a heat pipe. In yet another example, the heat-dissipation structure 500 may be a structure that is operated in a water cooling manner. However, the heat-dissipation structure 500 is not limited to these examples and may be variously modified.

The semiconductor package 2 may further include a thermally conductive layer 510, which is interposed between each of the semiconductor chips 300 and the heat-dissipation structure 500. The thermally conductive layer 510 may include a thermal interface material (TIM). The thermal interface material may include, for example, a polymer and/or thermally-conductive particles. The thermally conductive particles may be distributed in the polymer. Heat generated from the semiconductor chips 300 may be transferred to the heat-dissipation structure 500 through the thermally conductive layer 510.

According to an exemplary embodiment of the inventive concept, a release film including a light absorber and a gas foaming agent may be used. The release film may react with light to form an air gap between the release film and an interposer substrate attached to the release film. Due to the presence of the air gap, it may be possible to prevent a residue of the release film from being left on the interposer substrate when the interposer substrate is detached from the release film.

While exemplary embodiments of the inventive concept have been particularly shown and described, it will be understood by one of ordinary skill in the art that variations in form and detail may be made thereto.

What is claimed is:

1. A method of fabricating a semiconductor package, comprising:
   providing a preliminary interposer substrate including connection terminals on a carrier substrate such that the connection terminals are oriented outward;
   preparing a release film including a base layer, an intermediate layer, and an adhesive layer, wherein the intermediate layer comprises a light absorber,
   attaching the connection terminals to a first surface of the release film;
   detaching the carrier substrate from the preliminary interposer substrate;
   cutting the preliminary interposer substrate to form a plurality of interposer substrates;
   irradiating a first light of a first wavelength onto the release film to form an air gap between the connection terminals and the release film; and
   detaching the interposer substrates from the release film.

2. The method of claim 1, wherein the irradiating of the first light onto the release film to form the air gap between the connection terminals and the release film comprises directing the first light to the adhesive layer through the intermediate layer,
   the adhesive layer comprises a first portion, which encloses the connection terminals and has a curved shape, and a second portion, which is parallel to a bottom surface of the release film, and
   transmittance of the first light in the intermediate layer between the first portion and the base layer is higher than transmittance of the first light in the intermediate layer between the second portion and the base layer.

3. The method of claim 1, wherein the adhesive layer comprises a first adhesive layer provided on the intermediate substrate and a second adhesive layer interposed between the first adhesive layer and the intermediate substrate, and
   the first adhesive layer comprises at least one polysiloxane-based compound.

4. The method of claim 1, wherein the adhesive layer comprises a gas foaming agent, and
   the gas foaming agent reacts with the first light to form a first gas.

5. The method of claim 4, wherein the irradiating of the first light onto the release film to form the air gap between the connection terminals and the release film comprises:
   irradiating the first light onto a second surface, which is opposite to the first surface of the release film;
   reacting the first light with the gas foaming agent to produce the first gas; and
   capturing the first gas between the adhesive layer of the release film and the connection terminals to form an air gap.

6. The method of claim 1, further comprising irradiating a second light of a second wavelength onto the release film, after the irradiating of the first light and before the detaching of the interposer substrates from the release film.

7. The method of claim 6, wherein each of the first and second wavelengths ranges from 250 nm to 400 nm.

8. The method of claim 6, wherein the adhesive layer comprises a light curing agent that reacts with the light of the second wavelength.

9. The method of claim 1, wherein the connection terminals is attached to the first surface of the release film such that the adhesive layer forms a first portion, which encloses the connection terminals and has a curved shape, and a second portion, which is parallel to a bottom surface of the release film, and
   a difference between a thickness of the intermediate layer between the first portion and the base layer and a thickness of the intermediate layer between the second portion and the base layer ranges from 20 μm to 200 μm.

10. A method of fabricating a semiconductor package, comprising:
    receiving a preliminary interposer substrate including a preliminary interconnection layer, a preliminary intermediate substrate, and connection terminals on a carrier substrate, wherein the connection terminals are oriented outward;
    preparing a release film including a base layer, an intermediate layer, and an adhesive layer, which are sequentially stacked on the connection terminals of the preliminary interposer substrate;
    attaching the connection terminals to the adhesive layer of the release film;
    detaching the carrier substrate from the preliminary interposer substrate;
    cutting the preliminary interposer substrate to form a plurality of interposer substrates;
    irradiating a first light of a first wavelength onto the release film to form an air gap between the connection terminals and the adhesive layer;
    irradiating a second light of a second wavelength onto the release film; and
    detaching the interposer substrates from the release film and mounting a plurality of different semiconductor chips on each of the interposer substrates,
    wherein the adhesive layer of the release film comprises a gas foaming agent reacting with the first light and a light curing agent reacting with the second light.

11. The method of claim 10, wherein the first wavelength is different from the second wavelength.

12. The method of claim 10, wherein the irradiating of the first light onto the release film to form the air gap between the connection terminals and the adhesive layer comprises:
    directing the first light to the adhesive layer through the intermediate substrate;
    reacting the first light with the gas foaming agent in the adhesive layer to produce a first gas; and
    capturing the first gas between the adhesive layer and the connection terminals to form the air gap.

13. The method of claim 12, wherein, in the providing of the first light to the adhesive layer through the intermediate substrate, the adhesive layer comprises a first portion, which encloses the connection terminals and has a curved shape, and a second portion, which is parallel to a bottom surface of the release film, and
    a first amount of the first light incident into the first portion of the adhesive layer is greater than a second amount of the first light incident into the second portion.

14. The method of claim 12, wherein the first gas comprises nitrogen.

15. The method of claim 10, wherein the intermediate substrate comprises a light absorber absorbing a portion of the first light.

16. The method of claim 10, wherein the attaching of the connection terminals to the adhesive layer of the release film is performed to allow the adhesive layer to have a first portion, which encloses the connection terminals and has a curved shape, and a second portion, which is parallel to a bottom surface of the release film, and a vertical distance from the bottom surface of the release film to the first portion ranges from 20 µm to 50 µm.

17. The method of claim 10, wherein the irradiating of the second light of the second wavelength onto the release film comprises:

providing the second light to the adhesive layer through the intermediate substrate; and reacting the second light with the light curing agent in the adhesive layer to cure the adhesive layer.

18. The method of claim 10, wherein the air gap encloses a surface of the connection terminals.

19. A method of fabricating a semiconductor package, comprising:

providing a preliminary interposer substrate including an interconnection layer, a preliminary intermediate substrate, and connection terminals on a carrier substrate such that the connection terminals are oriented outward;

preparing a release film including a base layer, an intermediate substrate, and an adhesive layer, which are sequentially stacked on the connection terminals of the preliminary interposer substrate;

attaching the connection terminals to the adhesive layer of the release film;

removing the carrier substrate from the preliminary interposer substrate;

cutting the preliminary interposer substrate to form a plurality of interposer substrates separated from each other;

irradiating a first light of a first wavelength onto the release film to form an air gap between the connection terminals and the adhesive layer;

irradiating a second light of a second wavelength onto the release film;

detaching the interposer substrates from the release film;

mounting the interposer substrates on lower substrates;

mounting a plurality of semiconductor chips on each of the interposer substrates; and forming a mold layer on each of the interposer substrates to cover the plurality of semiconductor chips, wherein the plurality of semiconductor chips comprises a first semiconductor chip and a second semiconductor chip, which are different from each other, and the adhesive layer of the release film comprises a gas foaming agent that reacts with the first light and a light curing agent that reacts with the second light.

20. The method of claim 19, wherein the intermediate substrate comprises a light absorber absorbing a portion of the first light, and the light absorber comprises conjugated chemicals.

* * * * *